(12) United States Patent
Yoda (10) Patent No.: US 7,248,903 B2
(45) Date of Patent: Jul. 24, 2007

(54) MOBILE INSTRUMENT WITH FLEXIBLE PRINTED WIRING BOARD

(75) Inventor: Masaharu Yoda, Yokohama (JP)

(73) Assignee: Kyocera Corporation, Kyoto (JP)

( * ) Notice: Subject to any disclaimer, the term of this patent is extended or adjusted under 35 U.S.C. 154(b) by 294 days.

(21) Appl. No.: 10/746,820

(22) Filed: Dec. 23, 2003

(65) Prior Publication Data

US 2004/0198417 A1 Oct. 7, 2004

(30) Foreign Application Priority Data

Dec. 25, 2002 (JP) ............................. 2002-373911
Dec. 25, 2002 (JP) ............................. 2002-373912
Jan. 27, 2003 (JP) ............................. 2003-017574

(51) Int. Cl.
*H04M 1/00* (2006.01)

(52) U.S. Cl. ................. 455/575.1; 455/550.1; 455/575.3

(58) Field of Classification Search ............. 455/575.1, 455/575.3, 550.1, 556.2, 575.8, 90.1, 90.2, 455/90.3, 556.1; 379/408.01, 408.02
See application file for complete search history.

(56) References Cited

U.S. PATENT DOCUMENTS 5,541,813 A * 7/1996 Satoh et al. ................. 361/752
6,959,210 B2 * 10/2005 Nakamura ............... 455/575.3
7,001,193 B2 * 2/2006 Zaderej et al. .............. 439/165
2001/0051510 A1 * 12/2001 Nakamura .................... 455/90
2004/0048633 A1 * 3/2004 Sato et al. ............... 455/556.1
2004/0253972 A1 * 12/2004 Iwai et al. ............... 455/550.1
2005/0225952 A1 * 10/2005 Takagi ........................ 361/749

FOREIGN PATENT DOCUMENTS

| JP | 6311216 | 11/1994 |
|---|---|---|
| JP | 3093727 | 7/2000 |
| JP | 2002124779 | 4/2002 |

* cited by examiner

*Primary Examiner*—Sonny Trinh
(74) *Attorney, Agent, or Firm*—Joel E. Lutzker, Esq.; John C. Garces, Esq.; Schulte Roth & Zabel (57) ABSTRACT

A mobile instrument includes two housings that each incorporate circuit substrates, a hinge portion that joins the two housings such that they can rotate, and a flexible printed wiring board that is passed through a cavity formed inside the hinge portion, and that electrically connects together the circuit substrates in the two housings. The flexible printed wiring board is curled inside the cavity and an elastic body is placed on an inner side of the curled flexible printed wiring board.

18 Claims, 8 Drawing Sheets

MOBILE INSTRUMENT WITH FLEXIBLE PRINTED WIRING BOARD

CROSS-REFERENCE TO RELATED APPLICATIONS

This application claims priority to Japanese applications No. 2002-373911, filed Dec. 25, 2002, No. 2002-373912, filed Dec. 25, 2002 and No. 2003-17574, filed Jan. 27, 2003, the contents of which are incorporated herein by reference.

FIELD OF THE INVENTION

The present invention relates to mobile terminals. More particularly, the present invention relates to a mobile terminal such as a mobile telephone and a personal digital assistant (PDA) that is equipped with a flexible printed wiring board that connects together substrates provided in each of two housings that are joined together such that they can be folded open and closed.

BACKGROUND OF THE INVENTION

Typically, a folding type of mobile terminal device has a first housing that is provided with operation keys and a second housing that is provided with a display device. The housings are joined such that they are able to be opened and closed via a hinge portion and comprise a type of mobile terminal device (i.e., a mobile instrument). In this mobile terminal device, a flexible printed wiring board is provided via a cavity located in the hinge portion in order to electrically connect together circuit substrates built into each housing.

As is disclosed, for example, in Japanese Patent No. 3093727, a portion of a conventional flexible printed wiring board that is wound in a spiral configuration is positioned inside a cavity of a hinge portion. In addition, as is disclosed, for example, in Japanese Patent Application Laid-Open (JP-A) No. 06-311216, wires such as antenna wiring are passed through the inner diameter resulting when the flexible printed wiring board is wound in a spiral configuration in order to electrically connect a transmitting/receiving unit located in one housing with an antenna located in another housing.

However, in order to wind a flexible printed wiring board in a spiral configuration so as to position it inside a hinge cavity during the assembly of a mobile telephone, each flexible printed wiring board has to be wound individually by hand. Accordingly, this is time consuming and gives rise to poor work efficiency. Moreover, because the wind radius of a spirally wound flexible printed wiring board varies due to the tensile force imparted thereto when the housings are opened and closed, it is necessary to ensure that excessive force does not act on localized areas of the flexible printed wiring board. Furthermore, if excessive force does not act on localized areas of the flexible printed wiring board due to some particular cause when the flexible printed wiring board is simply wound in a spiral configuration inside the cavity in a conventional manner, there is a possibility that the soundness of the flexible printed wiring board will be impaired, such as bends and the like occurring in the flexible printed wiring board.

The entire cavity of the hinge portion is formed as one cylinder by placing curved surface portions of circular arc shaped plates that are provided at end portions of both housings alternating in the transverse direction of the housings. Because adjacent curved surface portions are moved relative to each other by the opening or closing of the casings, a slight gap is provided between the adjacent curved surface portions. Therefore, moisture may penetrate inside the housings from this gap. If moisture penetrates into the hinge portion, there is a possibility that this moisture will travel over the flexible printed wiring board located inside the hinge portion and will reach a circuit substrate built into the housing.

In cases where moisture penetrates to the circuit substrate, the proper operation of circuits and electronic components on the substrate is compromised. In order to solve this problem, as is disclosed, for example, in JP-A No. 2002-124779, a structure is known in which this spirally wound flexible printed wiring board is sandwiched between nipping members provided in each of the two housings. The nipping members prevent moisture from traveling along the flexible printed wiring board from the gap in the hinge portion and penetrating the hinge portion, and prevent shorts and corrosion of electronic components on a substrate on the housing side. These nipping members are formed by members having elasticity such as urethane, rubber, or sponge bodies.

However, this structure is not sufficient to prevent moisture from penetrating into the interior of the housing because the structure still allows the actual penetration of moisture into the cavity.

SUMMARY

In order to address the problems in the prior art, a hinge portion of a mobile instrument is presented that prevents moisture penetrating into a cavity in the hinge portion including a flexible printed wiring board. One aspect of the present invention is a hinge portion for joining a first housing to a second housing of a mobile instrument. The hinge portion includes a flexible wiring board inside a cavity defined by an inside of the hinge portion. The flexible wiring board connects a first circuit in the first housing to a second circuit in the second housing. The hinge portion also includes an elastic body on an inner surface of the flexible wiring board. The flexible wiring board is curled around the elastic body.

The foregoing and other features and advantages of preferred embodiments will be more readily apparent from the following detailed description, which proceeds with reference to the accompanying drawings.

DETAILED DESCRIPTION OF THE INVENTION

Figure 1:
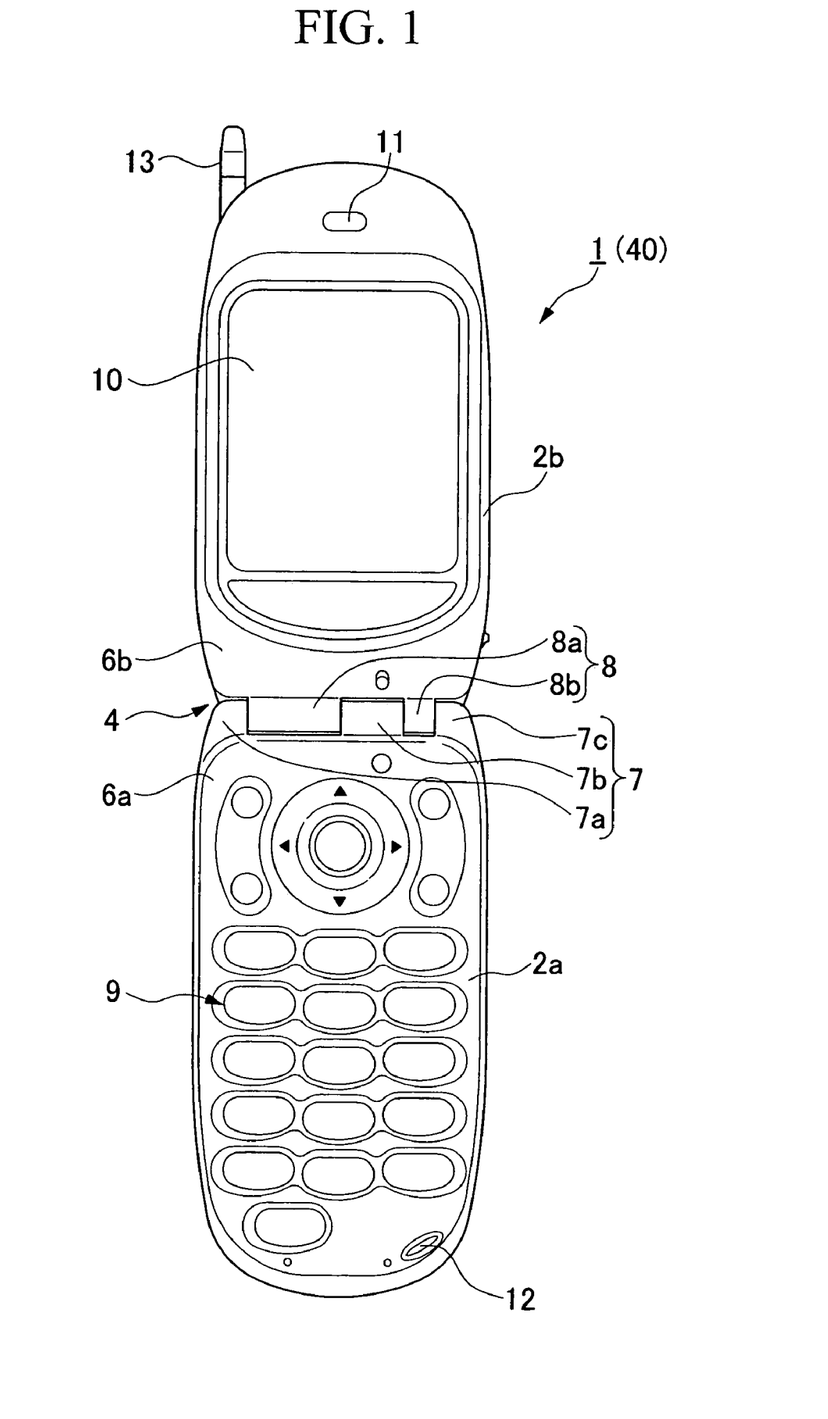
FIG. 1 is a plan view showing a preferred embodiment of a foldable mobile telephone in a state in which two housings are opened up.
Figure 2:
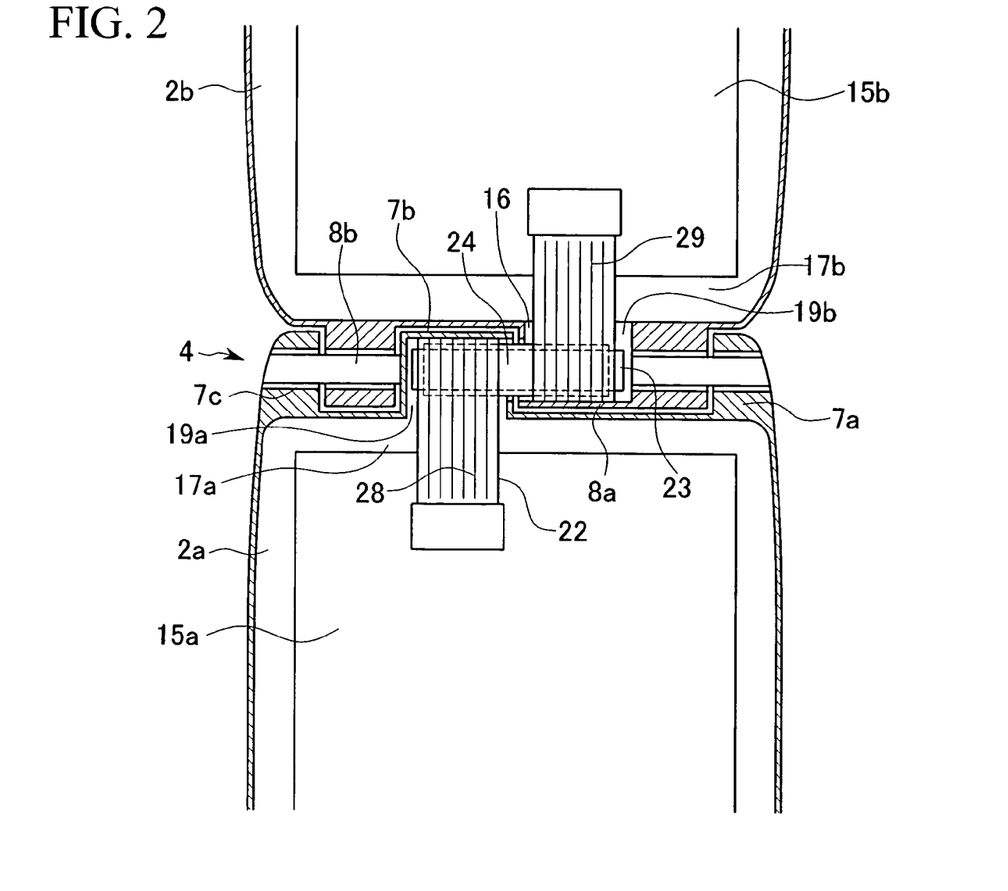
FIG. 2 is a schematic plan view showing a flexible printed wiring board is assembled in the embodiment of FIG. 1.

As is shown in FIGS. 1 and 2, the mobile terminal device in a preferred embodiment of the present invention is a foldable portable telephone in which two housings 2a and 2b are joined such that they can be relatively rotated around a hinge portion 4. The respective housings 2a and 2b are formed by main body portions 6a and 6b and hinge components 7 and 8. An operation key input unit 9 and microphone 12 are provided in the main body portion 6a, and a circuit substrate 15a having a transmitting/receiving unit is housed inside the main body portion 6a. A speaker 11, antenna 13, and display section 10 formed by an LCD or the like is provided in the main body portion 6b, and a circuit substrate 15b that controls display information and the like is housed inside the main body portion 6b. Each hinge component 7 and 8 is positioned at one end in the longitudinal direction of the respective main body portions 6a and 6b, and the hinge portion 4 is formed when the hinge components 7 and 8 are coupled together. The hinge component 7 of the one housing 2a is formed by three cylindrical portions 7a, 7b, and 7c aligned with a gap between each in the axial direction on a common center axis running in the transverse direction of the housing 2a. In the same way, the hinge component 8 of the other housing 2b is formed by two cylindrical portions 8a and 8b aligned with a gap between them in the axial direction on the common center axis running in the transverse direction of the housing 2b.

As is shown in FIG. 2, in the hinge portion 4 the cylindrical portions 7c, 8b, 7b, 8a, and 7a are aligned alternately in the transverse direction of the housings 2a and 2b. In addition, a hinge shaft (not shown) is contained inside each of the interior of the cylindrical portions 7c and 8b and the interior of the cylindrical portions 8a and 7a, thereby enabling the two housings 2a and 2b to be joined together. Communicating holes 19a and 19b that connect a cavity provided inside each of the cylindrical portions 7b and 8a with cavities 17a and 17b provided inside the main body portions 6a and 6b are formed in the cylindrical portions 7b and 8a in the center in the transverse direction of the housings 2a and 2b that form the hinge 4. The communicating holes 19a and 19b have a narrow elongated shape running in the transverse direction of the housings 2a and 2b.

Figure 3A:
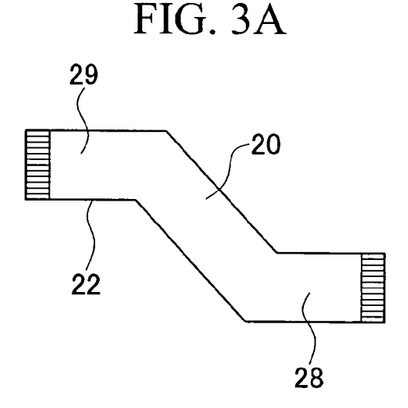
FIG. 3A is a schematic plan view of a flexible printed wiring board in the embodiment of FIG. 1.
Figure 3B:
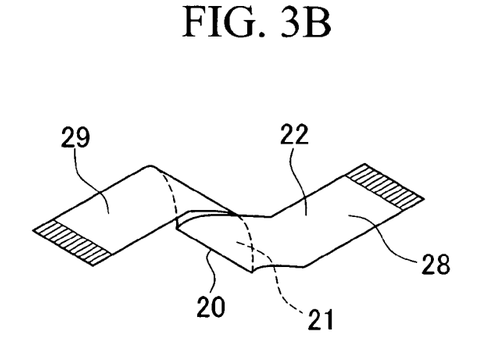
FIG. 3B is a schematic perspective view showing the flexible printed wiring board of FIG. 3A wound once.

The circuit substrates 15a and 15b inside the respective main body portions 6a and 6b are electrically connected together by a flexible printed wiring board 22. As is shown in FIG. 3A, the flexible printed wiring board 22 is formed in a belt shape and is provided with a crank portion 20 that is bent in the transverse direction at a position partway along the longitudinal direction thereof. In addition, as is shown in FIG. 3B, by winding the flexible printed wiring board 22 once in the longitudinal direction at the crank portion 20, the flexible printed wiring board 22 is housed in the cavity 16 with a loop portion 21 formed at a position partway along the flexible printed wiring board 22. Namely, the flexible printed wiring board 22 is housed with the loop portion 21 running along the inner circumferential surface of the cavity 16, and elongated portions 28 and 29 that extend in two directions from the loop portion 21 pass respectively into the communicating holes 19a and 19b. The elongated portions 28 and 29 are connected to the circuit substrates 15a and 15b inside the main body portions 6a and 6b by connectors provided at the two ends thereof.

Figure 4:
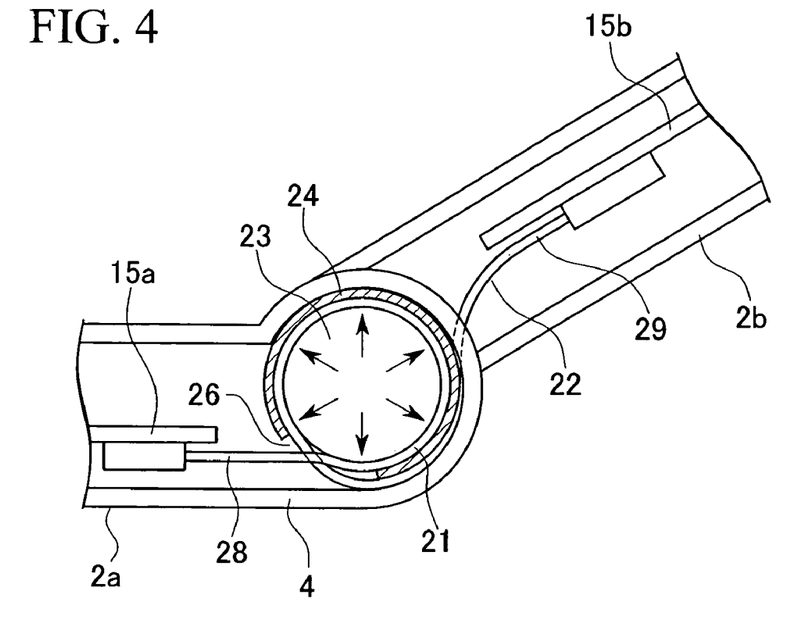
FIG. 4 is a cross-sectional view of a hinge portion of a mobile telephone of the of FIG. 1.
Figure 5:
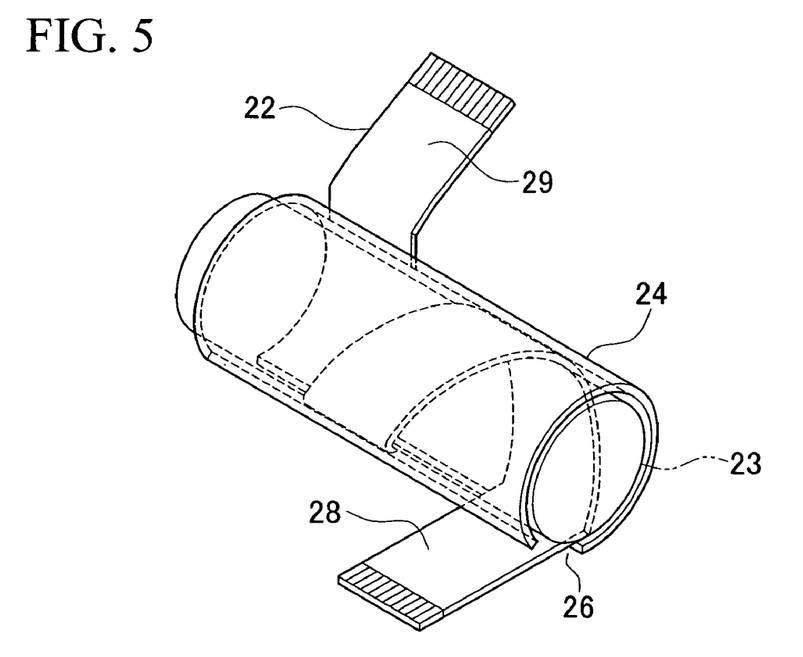
FIG. 5 is an enlarged perspective view showing a flexible printed wiring board and a sheet shaped waterproof material wound around the outside of an elastic body.

As is shown in FIGS. 4 and 5, the mobile telephone 1 according to the present embodiment is provided with a columnar elastic body 23 on the inside of the loop portion 21 housed inside the cavity 16, and with a sheet shaped waterproof material 24 on the outside of the loop portion 21. The elastic body 23 is formed, for example, by a sponge body and has a length substantially equal to the width of the loop portion 21. The elastic body 23 has a diameter larger than the internal diameter of the cavity 16 in a non-compressed, free state. Accordingly, when the elastic body 23 is contained inside the cavity 16, it is contracted to fit the internal diameter of the cavity 16.

The sheet shaped waterproof material 24 is formed, for example, by a rectangular rubber sheet film. The length of one side thereof is slightly shorter than the length in the transverse direction of the housings 2a and 2b when the cylindrical portions 7b and 8a are placed together. The length of the other sided thereof is shorter than the length of the inner circumference of the cavity 16. The sheet shaped waterproof material 24 is wound in one direction and is then inserted into the cavity 16. If the waterproof material 24 is then released inside the cavity 16, the sheet shaped waterproof material 16 unwinds and fits itself closely against the inner circumferential surface of the cavity 16. In this state, because the length of the sheet shaped waterproof material 24 in the circumferential direction is shorter than the length of the internal circumference of the cavity 16, the sheet shaped waterproof material 16 is formed into a C shape with a gap between two edges thereof.

As is shown in FIGS. 4 and 5, the elastic body 23, the sheet shaped waterproof material 24, and the flexible printed wiring board 22 are assembled together inside the cavity 16 of the housings 2a and 2b. The sheet shaped waterproof material 24 is positioned such that the outer circumferential surface thereof fits closely against the inner circumferential surface of the cavity 16, and the loop portion 21 of the flexible printed wiring board 22 is positioned on an inner side of the sheet shaped waterproof material 24. In addition, the columnar elastic body 23 is contained on the inner side of the loop portion 21.

In operation, when a user decides to make a telephone call using the mobile telephone 1, the two housings 2a and 2b are rotated relatively in a direction in which they open from each other around the hinge portion 4. As a result, the operation keys 9 of the housing 2a and the display section 10 of the housing 2b are exposed, and the user is able to operate the operation keys 9 while confirming the display content on the display section 10. As is shown in FIG. 4, the housings 2a and 2b are positioned at a relative angle to each other of approximately 150°. The loop portion 21 of the flexible printed wiring board 22 that connects the circuit substrates 15a and 15b inside the housings 2a and 2b is placed in a state of being wound approximately 1.5 times around the columnar elastic body 23.

When folding the mobile telephone 1 to a closed position, the two housings 2a and 2b are rotated relatively in a direction in which they close against each other around the hinge portion 4. As a result, the operation keys 9 of the housing 2a and the display section 10 of the housing 2b are placed at a join surface of the two housings 2a and 2b superimposed on each other and are hidden. This state is suitable for carrying as the operation keys 9 cannot be pressed and the display section 10 cannot be scratched. At this time, in accompaniment to the relative rotation of the housings 2a and 2b, the wind angle of the loop portion 21 of the flexible printed wiring board 22 inside the housings 2a and 2b around the circumference of the elastic body 23 is increased. Because the length of the flexible printed wiring board 22 is fixed, the wiring path is not lengthened by the increase in the wind angle. Therefore, there is a reduction in the size of the diameter of the loop portion 21.

In this case, in the mobile telephone 1 according to the present embodiment, the elastic body 23 receives pressure from the loop portion 21 acting towards the inside in the radial direction thereof, if the loop portion 21 contracts, because the columnar elastic body 23 is positioned on the inner side of the loop portion 21. As a result, the elastic body 23 also contracts such that its radius shrinks in size. The dimension of the radius of the loop portion 21 contracts in resistance to this elastic restoring force of the elastic member 23 because an elastic restoring force is generated in the elastic body 23 acting towards the outside in the radial direction.

In contrast, the loop portion 21 is enlarged when the housings 2a and 2b rotate relatively in a direction in which they open up from each other. Therefore, the pressure that had been acting on the elastic body 23 towards the inside in the radial direction thereof is alleviated, and the radius of the elastic body 23 is also enlarged to match the enlargement of the loop portion 21.

The loop portion 21 is normally urged by the elastic body 23 towards the outside in the radial direction, when the elastic body 23 is contained inside the cavity 16, because the elastic body 23 has an external diameter slightly larger than the internal diameter of the cavity 16. The loop portion 21 is constantly supported from the inside by the elastic body 23. Moreover, because the elastic body 23 is formed in a columnar shape, the loop 21 is supported along its entire circumference from the interior in the radial direction. Accordingly, when the size of the loop 21 contracts or expands following the opening or closing of the two housings 2a and 2b, bending stress generated in the flexible printed wiring board 22 is uniformly distributed across the entire circumference of the loop portion 21 and failures such as localized bends being generated can be prevented because the flexible printed wiring board 22 is supported from the inside by the elastic body 23.

Furthermore, according to the mobile telephone 1 of the present invention, the sheet shaped waterproof material 24 is able to cover from the inside the gap between the cylindrical portions 7b and 8a that form the cavity 16 because the sheet shaped waterproof material 24 is placed along the inner circumferential surface of the cavity 16. As a result, it is possible to effectively prevent moisture and dust from penetrating into the interior of the cavity 16 of the hinge portion 4.

In particular, moisture that might penetrate into the interior of the cavity 16 from the gap between the cylindrical portions 7b and 8a can be blocked from reaching the flexible printed wiring board 22 and the elastic body 23 on the inside of the sheet shaped waterproof material 24 because the sheet shaped waterproof material is formed by a waterproof material. Accordingly, in particular, when the elastic body 23 is formed by a hygroscopic material, it is possible to prevent moisture being absorbed into the elastic body 23. This structure is effective in that it is possible beforehand to prevent failures such as moisture that has been absorbed by the elastic body 23 subsequently evaporating and penetrating into the interiors of the main body portions 6a and 6b of the housings 2a and 2b.

Although the elastic body 23 may be formed by a sponge body, however, it should be understood that the present embodiment is not limited to this material and that it is also possible for the elastic body 23 to be formed from rubber or an elastic resin such as, for example, urethane resin, an acrylic based resin, or a thermoplastic polyamide resin.

The diameter of the elastic member 23 is larger than the inner diameter of the cavity 16 in a non-compressed, free state. It should also be understood, however, that the present embodiment is not limited to diameter and that it is also possible for the diameter of the elastic member 23 to be the same as or smaller than the inner diameter of the cavity 16. However, in order to effectively prevent localized bends in the loop portion 21, it is generally preferable that the diameter of the elastic member 23 is the same as or larger than the diameter of the cavity 16.

The waterproof material 24 is formed in a sheet shape. It should further be understood, however, that the waterproof material may also be formed as a substantially cylindrical body having a C shaped cross section. If this type of structure is employed, the loop portion 21 of the flexible printed wiring board 22 is held by this substantially cylindrical body in a state of being wound around the outer circumferential surface of the elastic body 23 by inserting an elastic body 23 around which the flexible printed wiring board 22 is wound into this substantially cylindrical body prior to the incorporation of the flexible printed wiring board 22 inside the hinge portion 4. Accordingly, there is a large scale improvement in the assembling work efficiency when the flexible printed wiring board 22 is assembled inside the hinge portion 4 because it is not necessary for an operator to hold the loop portion 21 by a finger or the like in order to maintain the shape of the loop.

Figure 6:
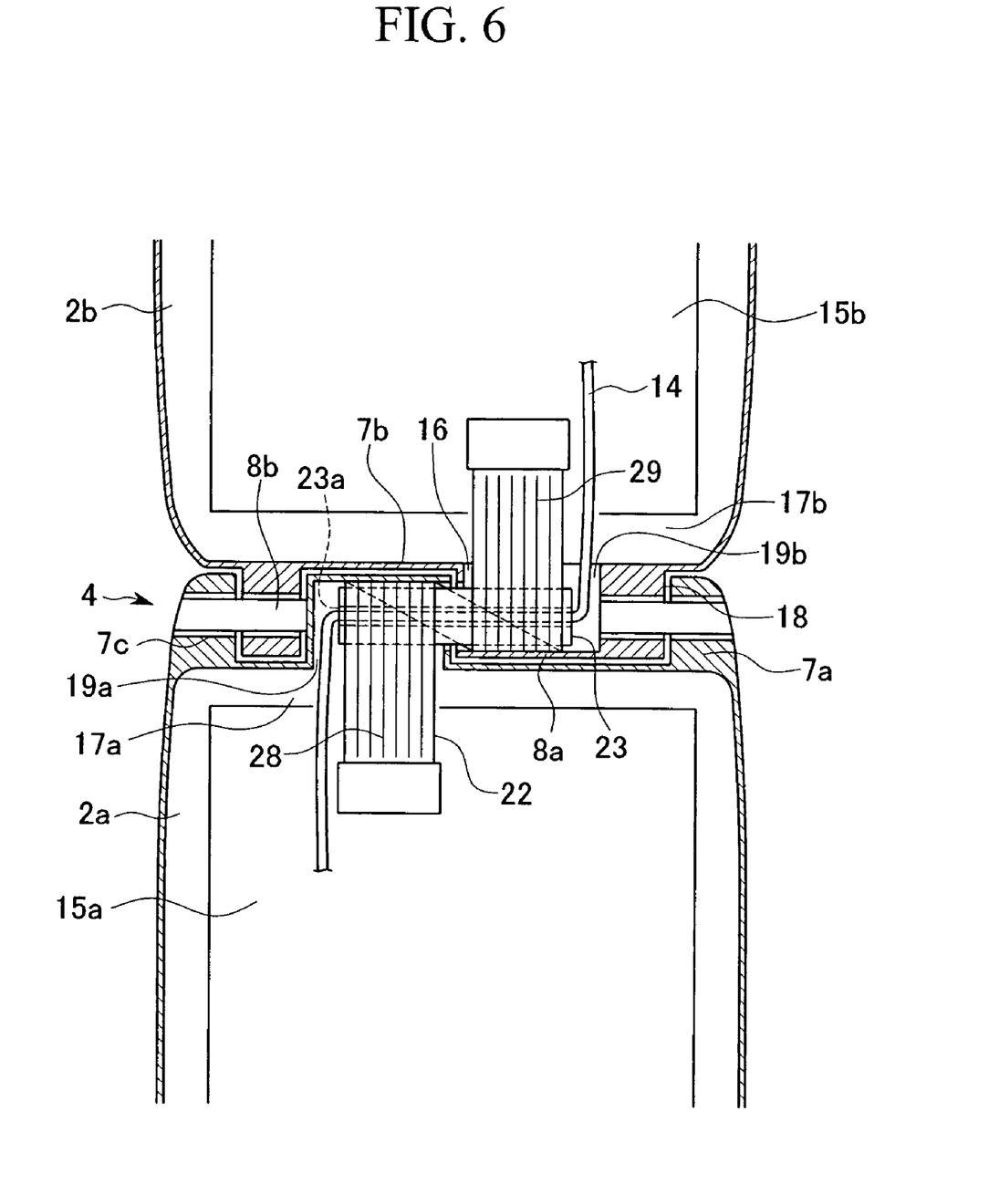
FIG. 6 is a schematic plan view showing another preferred embodiment of flexible printed wiring.

The mobile terminal device of another preferred embodiment of the present invention has a basic structure that is similar to that of the mobile terminal device shown in FIGS. 1 and 2. However, as is shown in FIG. 6, the mobile terminal device 40 (FIG. 1) according to the present embodiment is provided with a cylindrically shaped elastic body 23 on the inside of the loop portion 21 contained inside the cavity 16, and an antenna cable 14 (i.e., a wire) passing inside the elastic body 23.

Figure 7A:
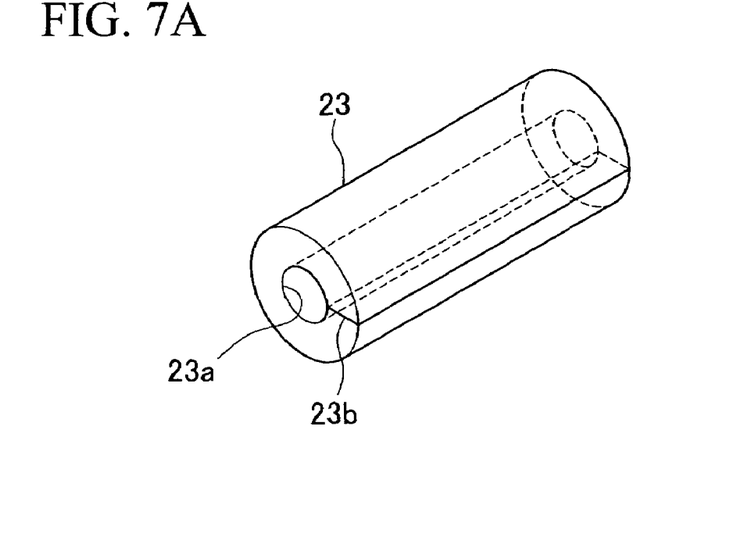
FIG. 7A is a schematic perspective view showing an elastic body in the embodiment of FIG. 6.

The elastic body 23 is formed, for example, from urethane resin or the like and, as is shown in FIG. 7A. The elastic body 23 is formed in a substantially cylindrical shape having a through hole 23a that penetrates a center portion of the elastic body 23 in the longitudinal direction. A slit 23b that extends from an outer surface of the elastic body 23 to an inner surface of the through hole is formed along the entire length in the longitudinal direction of the elastic body 23. In the elastic body 23 according to the present embodiment, the slit 23b is formed at a single location in the circumferential direction within a plane running in the radial direction and the longitudinal direction. The elastic body 23 also has a diameter larger than the inner diameter of the cavity 16 in a non-compressed, free state. Accordingly, when the elastic body 23 is contained inside the cavity 16, it contracts to fit the inner diameter of the cavity 16.

The antenna cable 14 electrically connects together an antenna 13 and a transmitting/receiving section (not shown) of the circuit substrate 15*a*. The antenna cable 14 passes through the through hole 23*a* inside the elastic body 23, and the two ends penetrate into the communicating holes 19*a* and 19*b* respectively. One end of the antenna cable 14 is connected to the antenna 13, while the other end is connected to the circuit substrate 15*a*.

Figure 7B:
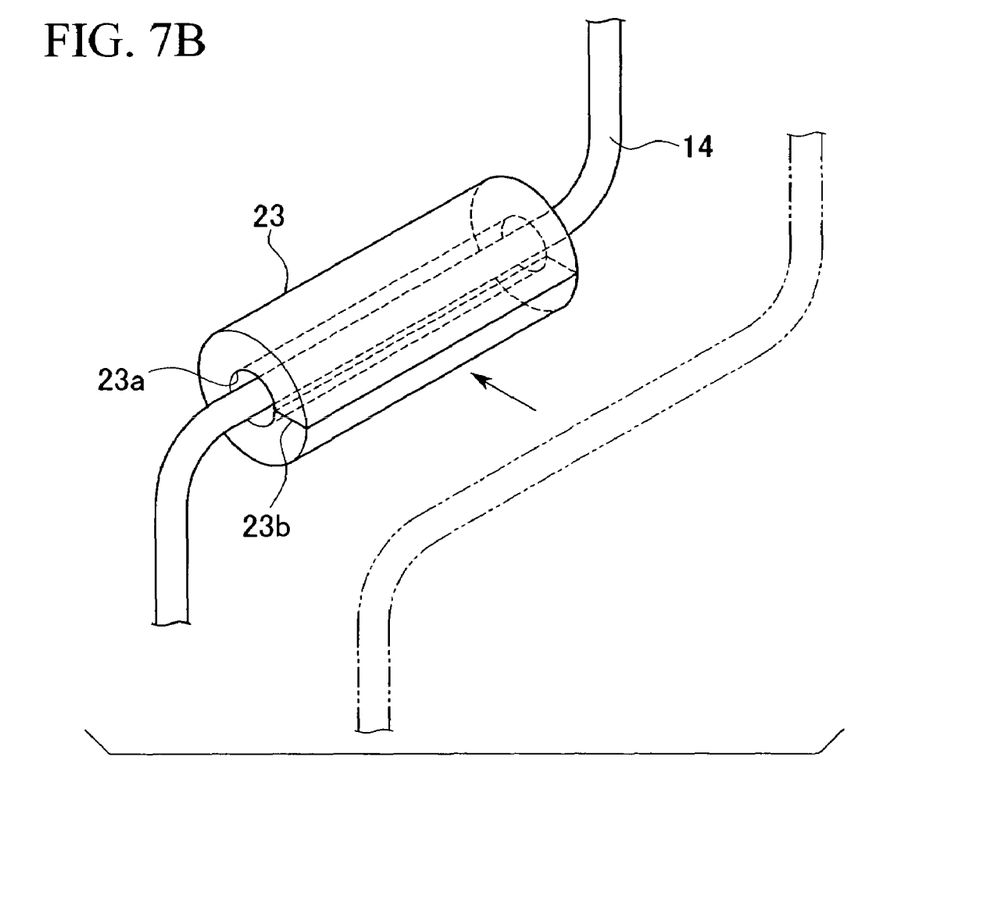
FIG. 7B is a schematic perspective view showing an antenna cable assembled with the elastic body shown in FIG. 7A.
Figure 8:
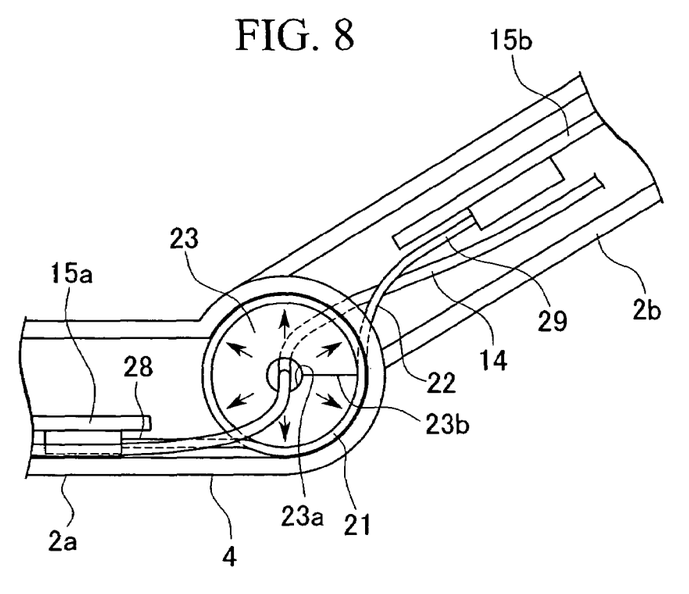
FIG. 8 is a cross-sectional view of a hinge portion of a mobile telephone.

As is shown in FIG. 8, the elastic body 23, the flexible printed wiring board 22, and the antenna cable 14 are assembled together inside the cavity 16 of the housings 2*a* and 2*b*. Prior to this assembling, as is shown in FIG. 7B, a portion of the antenna cable 14 partway along in the longitudinal direction is inserted into the through hole 23*a* in the radial direction from the outer surface of the elastic body 23 through the slit 23*b*. As a result, the antenna cable 14 is made to pass inside the through hole 23*a*. The flexible printed wiring board 22 is wound around the outer circumferential surface of the elastic body 23 through which passes the antenna cable 14. In this manner, the elastic body 23, the flexible printed wiring board 22, and the antenna cable 14 are contained inside the cavity 16.

In operation, when a user decides to make a telephone call using the mobile telephone 40, the two housings 2*a* and 2*b* are rotated relatively in a direction in which they open from each other around the hinge portion 4. As a result, the operation keys 9 of the housing 2*a* and the display section 10 of the housing 2*b* are exposed, and the user is able to operate the operation keys 9 while confirming the display content on the display section 10. As is shown in FIG. 8, the housings 2*a* and 2*b* are positioned at a relative angle to each other of approximately 150°. The loop portion 21 of the flexible printed wiring board 22 that connects the circuit substrates 15*a* and 15*b* inside the housings 2*a* and 2*b* is placed in a state of being wound approximately 1.5 times around the columnar elastic body 23.

When folding the mobile telephone 40 shut, the two housings 2*a* and 2*b* are rotated relatively in a direction in which they close against each other around the hinge portion 4. As a result, the operation keys 9 of the housing 2*a* and the display section 10 of the housing 2*b* are placed at a join surface of the two housings 2*a* and 2*b* superimposed on each other and are hidden. This is suitable for carrying as the operation keys 9 cannot be pressed and the display section 10 cannot be scratched.

At this time, in accompaniment to the relative rotation of the housings 2*a* and 2*b*, the wind angle of the loop portion 21 of the flexible printed wiring board 22 is increased inside the housings 2*a* and 2*b* around the circumference of the elastic body 23. The wiring path is not lengthened by the increase in the wind angle because the length of the flexible printed wiring board 22 is fixed. In this manner, there is a reduction in the size of the diameter of the loop portion 21.

In the mobile telephone 40 according to the present embodiment, if the loop portion 21 contracts, the elastic body 23 receives pressure from the loop portion 21 acting towards the inside in the radial direction because the columnar elastic body 23 is positioned on the inner side of the loop portion 21. As a result, the elastic body 23 also contracts such that its radius shrinks in size. The dimension of the radius of the loop portion 21 contracts in resistance to this elastic restoring force of the elastic member 23 because an elastic restoring force is generated in the elastic body 23 acting towards the outside in the radial direction. At this time, the elastic body 23 can be elastically deformed to a sufficient level because the through hole 24 is formed inside the elastic body 23.

In contrast, when the housings 2*a* and 2*b* rotate relatively in a direction in which they open up from each other, the loop portion 21 is enlarged. The pressure that had been acting on the elastic body 23 towards the inside in the radial direction thereof is alleviated, and the radius of the elastic body 23 is also enlarged to match the enlargement of the loop portion 21.

The loop portion 21 is normally urged by the elastic body 23 towards the outside in the radial direction thereof when the elastic body 23 is contained inside the cavity 16 because the elastic body 23 has an external diameter slightly larger than the internal diameter of the cavity 16. The loop portion 21 is constantly supported from the inside by the elastic body 23. Moreover, the loop 21 is supported along its entire circumference from the interior in the radial direction because the elastic body 23 is formed in a columnar shape. Accordingly, when the size of the loop 21 contracts or expands following the opening or closing of the two housings 2*a* and 2*b*, bending stress generated in the flexible printed wiring board 22 is uniformly distributed across the entire circumference of the loop portion 21 because the flexible printed wiring board 22 is supported from the inside by the elastic body 23, and failures such as localized bends being generated can be prevented.

Furthermore, according to this embodiment of the mobile telephone 40, when the elastic body 23 is contained inside the cavity 16, the elastic body 23 is constantly exerting an elastic restoring force towards the outer side in the radial direction. In this manner, the loop portion 21 is pressed against the inner circumferential surface of the cavity 16 by the elastic body 23. As a result, it is possible to cover inside the gap between the cylindrical portions 7*b* and 8*a* that form the cavity 16. Accordingly, it is possible to effectively prevent moisture and dust from penetrating into the interior of the cavity 16 of the hinge portion 4.

Furthermore, according to the mobile telephone 40 of the present embodiment, the antenna cable 14 may be passed through the through hole 23*a* via the slit 23*b* formed in the elastic body 23 prior to the flexible printed wiring board 22 being assembled in the hinge portion 4. In addition, the flexible printed wiring board 22 can be wound around the outer circumferential surface of the elastic body 23. Accordingly, it becomes easy to maintain the shape of the loop portion 21, and assembling work efficiency can be improved.

The elastic body 23 is formed from urethane resin. It should be understood, however, that the present embodiment is not limited to this material and that it is also possible for the elastic body 23 to be formed from rubber, sponge, or an elastic resin such as, for example, an acrylic based resin or a thermoplastic polyamide resin.

Furthermore, the diameter of the elastic member 23 is larger than the inner diameter of the cavity 16 in a non-compressed, free state. It should also be understood, however, that the present embodiment is not limited to these dimensions and that it is also possible for the diameter of the elastic member 23 to be the same as or smaller than the inner diameter of the cavity 16. However, in order to effectively prevent localized bends in the loop portion 21, it is preferable that the diameter of the elastic member 23 is the same as or larger than the diameter of the cavity 16.

In addition, the slit 23*b* is formed in the elastic body 23. It should be understood, however, that the elastic body 23 may also be a simple cylinder with no slit 23 formed therein.

In order to greatly improve the assembly work efficiency, however, it is preferable that the slit 23b is provided. The slit 23b is formed within a plane running in the radial direction and longitudinal direction. The present embodiment, however, is not limited to this slit formation and the slit does not need to be within a plane provided that extends across the entire radial direction and longitudinal direction.

The elastic body 23 has a cylindrical configuration. It should yet further be understood, however, that the present embodiment is not limited to this configuration and that the elastic body 23 may also be a columnar shaped object through the middle of which a through hole is formed to allow the antenna cable 14 to pass through. Moreover, in the present embodiment, an example is provided in which the antenna cable 14 is passed inside the through hole 23a of the elastic body 23. It should also be understood, however, that the wiring may be inserted inside the through hole 23a in the elastic body 23 when the microphone 12 and speaker 11 are electrically connected via wiring with a circuit substrate incorporated into a different housing from the housing containing the microphone 12 and speaker 11. If wiring other than the flexible printed wiring board that connects together circuit substrates incorporated into two housings is present in this way, the wiring can be easily positioned by inserting the wiring inside the through hole 23a in the elastic body 23.

Tthe through hole 23a of the elastic body 23 may also be filled with drying agents or aromatic agents. By filling the through hole 23a with a drying agent in this manner, even if there is a temporary ingress of moisture into the cavity, the moisture is absorbed by the drying agent preventing the moisture from penetrating into the housing. In addition, by filling the through hole 23a with an aromatic agent, the mobile terminal device can be endowed with a variety of fragrances.

Figure 10:
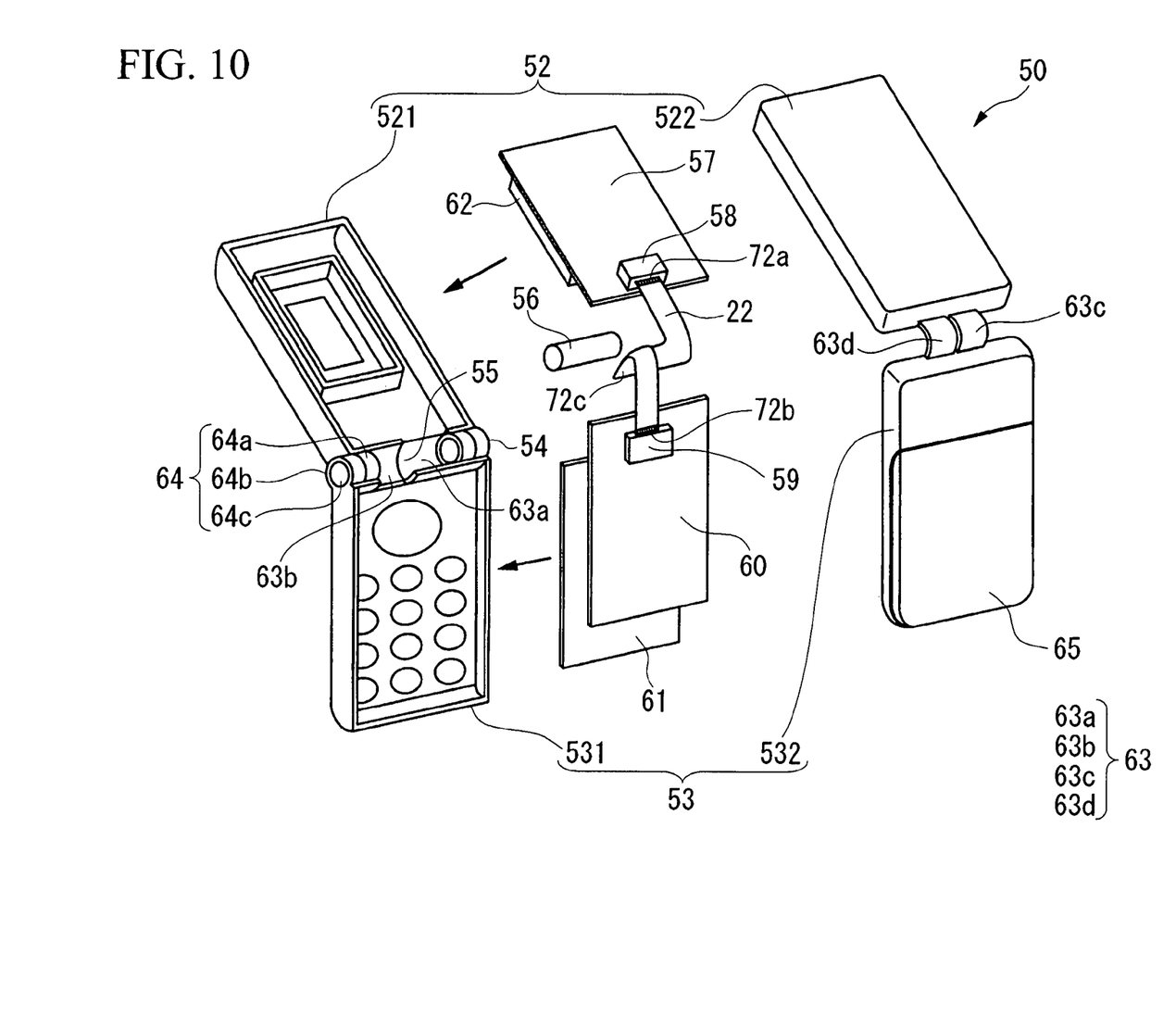
FIG. 10 is a perspective view showing the packaging of internal components in yet another preferred embodiment of a foldable mobile telephone.

It is also possible to provide a rod shaped core material formed from a resin or a metal such as an aluminum alloy, stainless steel alloy, or iron. If a core material is provided inside the elastic body 23 in this manner, the elastic body 23 may be easily handled by sandwiching both ends of the core material between fingers even if the elastic body is easily deformed and hard to grasp when held directly by hand, thus enabling work efficiency when placing the elastic body 23 inside the cavity 16. The core material may be either a solid rod-shaped body or a hollow rod-shaped body, but if a hollow rod-shaped body is used then the antenna cable 14 can be inserted inside the hollow portion FIG. 10 is an exploded perspective view of yet another preferred embodiment of the present invention. A mobile telephone 50 has a first housing 52 and a second housing 53. The first and second housings 52 and 53 are formed by fitting together respectively front cases 521 and 531 with rear cases 522 and 532. One end of each of the front cases 521 and 531 is connected to a hinge portion 54, and the front cases 521 and 531 are able to be opened and closed relative to each other via the hinge portion 54. The hinge portion 54 is formed by a pair of hinges 64 and a cylindrical portion 63 located between the hinges 64. Cylindrical hinge bearings 64a and 64b that form the hinge 64 are provided respectively at two corner portions of the aforementioned one end of the front cases 521 and 531 of the housings 52 and 53. The front case 521 and the front case 531 are joined together by a shaft (hinge unit) 64c inserted through the hinge bearing 64a of the front case 521 and the hinge bearing 64b of the front case 531.

The cylindrical portion 63 is formed by fitting together front covers 63a and 63b that are provided in the front case 521 and 531 and that have a semicircular cross section of substantially the same diameter as the outer diameter of the hinge bearings 64a and 64b, and rear covers 63c and 63d that are provided in the rear case 522 and 532 and that have a semicircular cross section of substantially the same diameter as the outer diameter of the hinge bearings 64a and 64b. As a result, a cavity 55 having a circular cross section is formed.

The first housing 52 contains a substrate 57 housed between the front case 521 and the rear case 522, and a liquid crystal display unit 62 installed at a front surface of the substrate 57 is visible from the front case 521. The substrate 57 is also provided with radio units for an antenna and a speaker (neither of which are shown), and the respective electronic components are electrically connected.

The second housing 53 contains a substrate 60 housed between the front case 531 and the rear case 532, and a key button sheet 61 installed at a front surface of the substrate 60 is visible from the front case 531. The substrate 60 is also provided with a microphone (not shown), and the respective electronic components are electrically connected. A battery 65 is also mounted in the rear case 532.

Connector receiving portions 58 and 59 (i.e. terminal receiving portions) are located respectively at a rear surface of the substrates 57 and 60, and are each electrically connected with a connector (i.e., terminal portion) of a flexible printed wiring board 72. The flexible printed wiring board 72 is described below in detail, however, briefly, it is wound around an elastic body 56 and is housed within the cavity 55. The flexible printed wiring board 72 is able to bend freely in accordance with a rotation of the first housing 52 and the second housing 53 around the hinge portion 54. The elastic body 56 has a columnar shape having a slightly larger diameter than the inner diameter of the cylindrical portion 63, and contracts elastically when contained inside the cavity 55 so as to press against the inner wall of the cylindrical portion 63. The elastic body 56 may be formed from rubber, sponge, or an elastic resin such as urethane. Preferably, urethane resin is used.

Figure 9A:
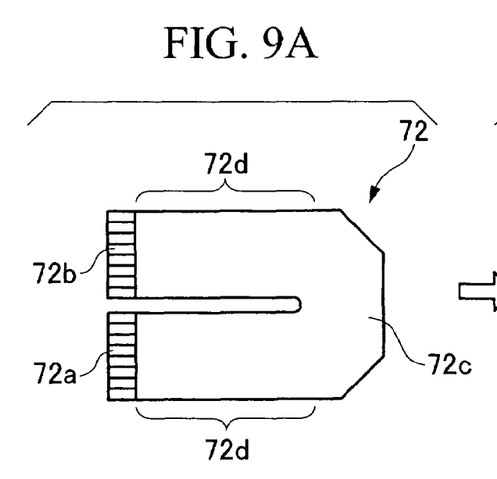
FIGS. 9A and 9B are schematic views of a flexible printed wiring board.

As is shown in FIG. 9A, the flexible printed wiring board 72 is formed substantially in a U-shape by cutting a slit into a center portion of one end of a substantially square plate. A first connector 72a (i.e., a terminal portion) and a second connector 72b (i.e., a terminal portion) are provided in the end where the slit is cut on either side of the slit. Strip shaped elongated portions 72d and 72d that each form a flexible wiring pattern extend from the first connector 72a and the second connector 72b. The elongated portions 72d are joined by a joining portion 72c where the slit has not been cut. Accordingly, the first connector 72a and the second connector 72b branch off from the joining portion 72c via the elongated portions 72d.

In the present embodiment, the boundary between the joining portion 72c and the elongated portions 72d is not rigorously demarcated, and the portions where the respective flexible wiring patterns extend from the first connector 72a and the second connector 72b are taken as the elongated portions 72d, while the portion where the elongated portions 72d are connected together is taken as the joining portion 72c.

Figure 9B:
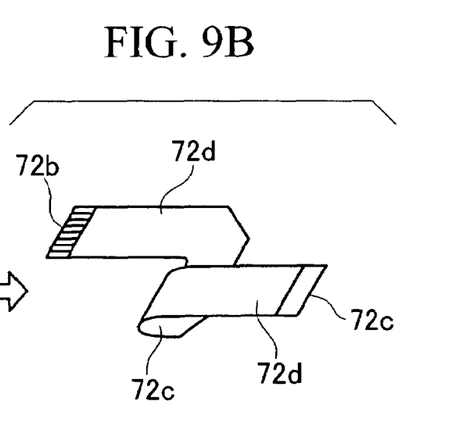
Figure 11:
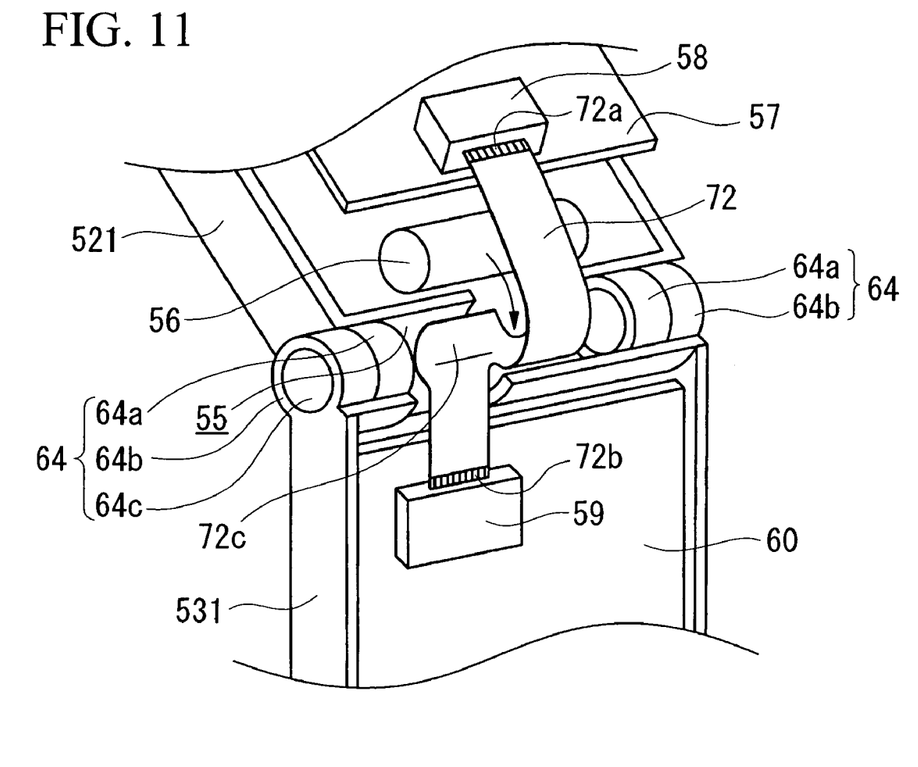
FIG. 11 is an enlarged perspective view showing a flexible printed wiring board fitted in an internal space in the embodiment of FIG. 10.

In assembly, as is shown in FIG. 9B, the first connector 72a of the U-shaped flexible printed wiring board 72 is made to face in the opposite direction from the second connector 72b by curling and folding back the joining portion 72c. The joining portion 72c is bent (i.e., wound) around an axis in a direction perpendicular to the direction in which the elongated portions 72d extend. As is shown in FIG. 11, in this folded back state, the first connector 72a is connected to the connector receiving portion (i.e., terminal receiving portion) 58, and the second connector 72*b* is connected to the connector receiving portion (i.e., terminal receiving portion) 59. The first housing 52 and the second housing 53 are in an opened up state.

The substrate 57 and the substrate 60 that are electrically connected by the flexible printed wiring board 72 are placed respectively in the front case 521 of the first housing and the front case 531 of the second housing, and the wound joining portion 72*c* is placed inside the cavity 55. The elastic body 56 is placed inside the wound portion of the joining portion 72*c*. As a result, the joining portion 72*c* of the flexible printed wiring board 72 is wound around the elastic portion 56 so that the flexible printed wiring board 72 is housed in a state of being pressed against the inside wall of the front covers 63*a* and 63*b*. The rear case 522 of the first housing 52 and the rear case 532 of the second housing 53 are fitted respectively onto the front cases 521 and 531. Accordingly, the rear covers 63*c* and 63*d* are attached to the outer surface of the joining portion 72*c*.

Figure 12:
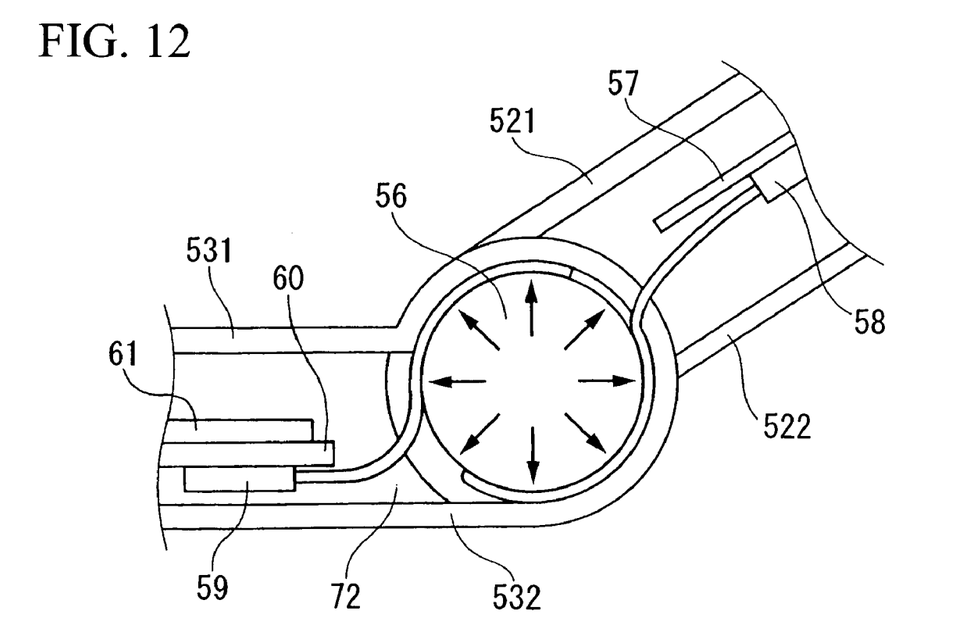
FIG. 12 is a cross-sectional view taken in a direction perpendicular to an axial direction of the hinge portion of the mobile telephone of FIG. 10.

FIG. 12 shows a cross-sectional view of the interior of the cavity 55 taken in a direction perpendicular to the axial direction of the hinge portion 54 of a completed mobile telephone 50. The elastic body 56 expands inside the cavity 55 in the directions indicated by the arrows in FIG. 12 (i.e., in the radial direction of the hinge portion 54) because the elastic body 56 is formed from urethane resin or the like. Accordingly, the flexible printed wiring board 72 is made to press tightly against the inner wall of the cavity 55.

As has been described above, if the flexible printed wiring board shown in FIG. 9A is used, a substantial improvement in the work efficiency when fitting the flexible printed wiring board can be achieved because it is only necessary to fold back one connector of the flexible printed wiring board and connect the two connectors respectively with the substrates incorporated in the housings, and to then position the joining portion of the flexible printed wiring board in the front cover.

Moreover, if the elastic body is inserted into the cavity after the flexible printed wiring board has first been attached to the front cover, then the flexible printed wiring board can be bent gently and guided to the substrate of the housing along the curved surface of the elastic body. Accordingly, even when the housing is folded shut, it is difficult for the radius of the folded portion of the flexible printed wiring board to become smaller. In addition, because twisting and the like tends not to occur, it is difficult for the wiring to be sheared so that the number of times the housings can be folded as well as the reliability are improved.

By placing an elastic body that uses rubber or an elastic resin on the inner side of the hinge portion gap, moisture and sweat can be prevented from penetrating through the gap, enabling corrosion and short circuiting of electronic components on the substrates in the housings to be prevented. Moreover, because the two terminal portions of the flexible printed wiring board of the present embodiment run in the same direction due to the flexible printed wiring board having a U-shape or the like when seen in plan view, there is no need for the flexible printed wiring board to be wound in a spiral, as is the case conventionally when this flexible printed wiring board is placed inside the cavity in the hinge portion. In addition, because it is sufficient if the joining portion is bent in the longitudinal direction of the elongated portions, there is no need to make the flexible printed wiring board longer than is necessary. Accordingly, costs can be reduced.

In another preferred embodiment, the flexible printed wiring board has a U-shape, however, any branched shape is sufficient such as a V shape or U-shape.

In the present embodiment described above, an example is described in which the connectors 72*a* and 72*b* are provided on the flexible printed wiring board and the connector receiving portions 58 and 59 are provided on the substrates 57 and 60. It should be understood, however, that it is also possible to employ a structure in which the locations of the connectors and the connector receiving portions are reversed. Furthermore, the flexible printed wiring board 72 of the present embodiment may also be applied to the preferred embodiments described above, in which case the same operation effects as in the present embodiment can be achieved.

Embodiments of the present invention have been described above in detail with reference made to the drawings, however, the specific structure of present invention is not limited to the above embodiments and other design modifications may be included as long as they do not depart from the spirit or scope of the present invention.

For example, in the above description of the embodiments, a foldable type of mobile telephone is used as an example, however, the present invention is not limited to a foldable type of mobile telephone and it is to be understood that the present invention may also be applied to other mobile terminal devices such as PDA.

Although the invention described herein is with reference to particular embodiments, it should be understood that these embodiments are merely illustrative of the principals and application of the present invention. It should therefore be understood that modifications may be made to the exemplary embodiments described herein, and that other arrangements may be devised without departing from the spirit and scope of the present invention as defined by the following claims.

What is claimed is:

1. A mobile instrument comprising:
   two housings that each incorporate circuit substrates;
   a hinge portion that joins the two housings such that they can rotate; and
   a flexible printed wiring board that is passed through a cavity formed inside the hinge portion, and that electrically connects together the circuit substrates in the two housings, wherein
   the flexible printed wiring board is curled inside the cavity and an elastic body is placed on an inner side of the curled flexible printed wiring board wherein a transverse cross-sectional configuration of the elastic body and a transverse cross-sectional configuration of the cavity are substantially circular, and a diameter of the elastic body is equivalent to or greater than a diameter of the cavity.

2. The mobile instrument according to claim 1, wherein a waterproof material is provided that covers an outer side of the curled flexible printed wiring board and an outer side of the elastic body.

3. The mobile instrument according to claim 2, wherein the waterproof material is a substantially cylindrical body having a C-shaped transverse cross section, and an inner diameter of the substantially cylindrical body is equivalent to or less than a diameter of the elastic body.

4. The mobile instrument according to claim 1, wherein the elastic body is a columnar shaped body having a through hole.

5. The mobile instrument according to claim 4, wherein in one of the two housings there is provided a component that is either an antenna, a microphone, or a speaker, and this component is electrically connected via wiring with a circuit substrate incorporated in the other housing, and the wiring is made to pass through the through hole formed in the elastic body.

6. The mobile instrument according to claim 5, wherein the elastic body has a slit formed therein that extends from an outer surface of the elastic body to an inner surface of the through hole along an entire length in a longitudinal direction of the elastic body.

7. The mobile instrument according to claim 4, wherein the through hole is filled with a drying agent or aromatic agent.

8. The mobile instrument according to claim 4, wherein a hollow or solid rod shaped body is placed inside the through hole.

9. The mobile instrument according to claim 8, wherein in one of the two housings there is provided a component that is either an antenna, a microphone, or a speaker, and this component is electrically connected via wiring with a circuit substrate incorporated in the other housing, and the wiring is made to pass through the through hole formed in the elastic body.

10. The mobile instrument according to claim 1, wherein the flexible printed wiring board is a belt shaped body that, when laid out flat, has a crank portion that is curled in a transverse direction at a position partway along the longitudinal direction of the flexible printed wiring board.

11. The mobile instrument according to claim 1, wherein the flexible printed wiring board is a belt shaped body having two elongated portions and a joining portion that joins the two elongated portions at end portions thereof, and, when the flexible printed wiring board is laid out flat, the two elongated portions are placed facing in substantially the same direction.

12. The mobile instrument according to claim 1, wherein the mobile instrument is a mobile telephone having a display unit and a speaker in one of the two housings and an input unit and a microphone in the other of the two housings.

13. The mobile instrument according to claim 1, wherein the mobile instrument is a personal digital assistant (PDA) having a display unit in one of the two housings and an input unit in the other of the two housings.

14. A mobile instrument comprising:
two housings that each incorporate circuit substrates;
a hinge portion that joins the two housings such that they can rotate; and
a flexible printed wiring board that is passed through a cavity formed inside the hinge portion, and that electrically connects together the circuit substrates in the two housings, wherein
the flexible printed wiring board is wound around an outer circumference of the columnar shaped elastic body, and the elastic body around which the flexible printed wiring board has been wound is placed inside the cavity.

15. The mobile instrument according to claim 14, wherein the mobile instrument is a mobile telephone having a display unit and a speaker in one of the two housings and an input unit and a microphone in the other of the two housings.

16. The mobile instrument according to claim 14, wherein the mobile instrument is a personal digital assistant (PDA) having a display unit in one of the two housings and an input unit in the other of the two housings.

17. A mobile instrument comprising:
two housings that each incorporate circuit substrates;
a hinge portion that joins the two housings such that they can rotate; and
a flexible printed wiring board that is passed through a cavity formed inside the hinge portion, and that electrically connects together the circuit substrates in the two housings, wherein
the flexible printed wiring board is provided with two terminal portions that are connected with the respective circuit substrates provided in the two housings, and a flexible wiring portion that connects the two terminal portions, and wherein
the flexible wiring portion has two elongated portions that extend respectively from the two terminal portions and a joining portion that joins the two elongated portions at end portions thereof, and, when laid out flat, the two terminal portions are each placed facing in the same direction, and wherein
the flexible printed wiring board is contained inside a cavity provided in the hinge portion with the joining portion curled in a longitudinal direction of the elongated portions.

18. The mobile instrument according to claim 17, wherein a columnar shaped elastic body is placed on an inner side of the curled joining portion.

* * * * *